US008351218B2

(12) United States Patent
Stowers et al.

(10) Patent No.: US 8,351,218 B2
(45) Date of Patent: Jan. 8, 2013

(54) MULTI-TIER MASS INTERCONNECT DEVICE

(75) Inventors: Jeffery P. Stowers, Mount Sidney, VA (US); Randall C Garman, Waynesboro, VA (US); David Rocker, Charlottesville, VA (US)

(73) Assignee: Virginia Panel Corporation, Waynesboro, VA (US)

( * ) Notice: Subject to any disclaimer, the term of this patent is extended or adjusted under 35 U.S.C. 154(b) by 867 days.

(21) Appl. No.: 12/333,350

(22) Filed: Dec. 12, 2008

(65) Prior Publication Data

US 2009/0223712 A1 Sep. 10, 2009

Related U.S. Application Data

(60) Provisional application No. 61/034,029, filed on Mar. 5, 2008.

(51) Int. Cl.
*H05K 7/02* (2006.01)

(52) U.S. Cl. ........................................................ 361/810

(58) Field of Classification Search .................. 361/810, 361/807, 829

See application file for complete search history.

(56) References Cited

U.S. PATENT DOCUMENTS 3,166,369 A 1/1965 Trump
3,419,842 A 12/1968 Taylor
4,212,508 A 7/1980 Cline et al.
4,213,666 A 7/1980 Braginetz et al.
4,329,005 A 5/1982 Braginetz et al.
4,655,530 A 4/1987 Sheets et al.
5,037,321 A 8/1991 Uratsuji et al.
5,103,378 A 4/1992 Stowers et al.
5,227,718 A 7/1993 Stowers et al.
5,420,519 A 5/1995 Stowers et al.
5,562,458 A 10/1996 Stora et al.
5,576,631 A 11/1996 Stowers et al.
5,633,597 A 5/1997 Stowers et al.
5,850,147 A 12/1998 Stowers et al.
5,936,421 A 8/1999 Stowers et al.
5,942,906 A 8/1999 Stowers et al.
5,966,023 A 10/1999 Burgers et al.
6,547,587 B2 4/2003 Hurst et al.
6,824,405 B2 11/2004 Hubbard et al.
6,869,321 B1 3/2005 Ashby et al.
6,872,006 B2 3/2005 Langouet et al.
6,882,138 B2 4/2005 Langouet et al.
6,948,952 B2 9/2005 Hubbard et al.
7,091,415 B2 * 8/2006 Ashby et al. .................. 174/535
7,267,563 B2 9/2007 Stowers
7,297,014 B1 11/2007 Stowers et al.
D561,125 S 2/2008 Stowers et al.

* cited by examiner

*Primary Examiner* — Jeremy Norris
*Assistant Examiner* — Tremesha S Willis
(74) *Attorney, Agent, or Firm* — 24IP Law Group; Timothy R. DeWitt

(57) ABSTRACT

An interface receiver having multiple tiers such that a first tier in the receiver houses a module having its longest dimension in a first direction and a second tier houses a module having its longest dimension in a second direction perpendicular to the first direction. The receiver has three or more cams on each of two parallel sides. The receiver is capable of being mated with "legacy" test adapters having two pairs of parallel sides with each side in one of the pairs having two locator elements for engaging with the cams of the receiver and new test adapters of the present invention having an odd number of locator elements on each side.

14 Claims, 6 Drawing Sheets

MULTI-TIER MASS INTERCONNECT DEVICE

CROSS-REFERENCE TO RELATED APPLICATIONS

The present application claims the benefit of the filing date of U.S. Provisional Application Ser. No. 61/034,029 entitled "Multi-Tier Mass Interconnect Device," and filed on Mar. 5, 2008.

The aforementioned provisional application is hereby incorporated by reference in its entirety.

STATEMENT REGARDING FEDERALLY SPONSORED RESEARCH OR DEVELOPMENT

Not applicable.

BACKGROUND OF THE INVENTION

1. Field of the Invention

The invention relates broadly to an interface connection system and, more specifically, to a multi-tier mass interconnect device that allows for modules to be inserted in directions perpendicular to one another. Such interface connection systems require the frequent placement of interchangeable test adapters (ITA) or wiring modules with multiple minute electrical contacts in operative engagement with opposite coacting electrical contacts of, for example, receiver modules. The receiver contacts and interchangeable test adapter/wiring contacts should engage with precision to minimize wear and to prevent damaging the delicate and expensive equipment.

2. Brief Description of the Related Art

A variety of mass interconnect devices have been used in the past. One example of prior art interface systems was disclosed in U.S. Pat. No. 4,329,005, entitled "Slide Cam Mechanism for Positioning Test Adapter in Operative Relationship with a Receiver," which was assigned to Virginia Panel Corporation. In the '005 Patent, the receiver included an inner frame and outer walls. Between the outer walls and adjacent sides of the receiver frame were placed fixed hanger plates provided with straight slots and interior slides having coacting cam slots. The slides were driven by a hand lever and attached round torsion shaft with connected linkage having an over-dead-center locked position. Movement of the hand lever would cause the slides to move parallel to the outer walls and interior sides. Modules for holding various electrical contacts were mounted in the receiver parallel to the direction of movement of the slides.

The individual test adapter, or ITA, had four split roller dual bearings or rollers on common dry lube sleeves that would rotate oppositely during the camming action to minimize friction. The individual test adapter rollers rested on dwell shoulders of the cam slots and then descended through the straight slots during movement of the slides of the receiver to produce positive straight-on engagement of the test adapter and receiver multiple contacts. The slides had elongated linear guide bearings with dry lube pads for precision free movement. The slides were connected to a cylindrical torsion shaft via linkage. Like the receiver modules, the ITA modules were mounted in the system in a direction parallel to the ITA sides on which the rollers were located. When modules, pins, patchcords, and perhaps a cover are mounted to or on the interface test adapter, the assembly is sometimes referred to as a "fixture."

Another prior art system has been known as the MAC Panel Series 06, or rotating latch, interface device. In the rotating latch type device, the camming is performed by plates that rotate rather than moving in a linear fashion. In the rotating latch devices, the connector modules have been mounted to the receiver and test adapter frame parallel to the plane of rotation of the rotating latches.

Another prior art system sold by Virginia Panel Corporation included a receiver that included slides similar to those disclosed in the '005 patent but used pins at two corners, diagonal from one other, on the receiver. These pins inhibited vertical movement of the ITA in the receiver to produce straight-on engagement. This prior art system included machined side rails and a cylindrical torsion shaft.

Another prior interface device is known as the TTI Testron VG Series interface device. This device may be in a tabletop or a rack-mounted form. This VG Series device included a fixture support plate mounted to the receiver in a direction perpendicular to the face of the receiver. The receiver would be mounted directly to the test equipment.

The TTI Testron fixture, or test adapter, would be engaged to the receiver by lifting the fixture onto a pair of hooks protruding from the face of the receiver and then resting the fixture on the support plate. A handle and gears were used to pull the hooks, and hence, the fixture, into the receiver to cause the electrical contacts in the receiver and the fixture to mate.

Further, U.S. Pat. No. 7,091,415, entitled "Low Profile Mass Interconnect Device" discloses an interface device in which the modules are oriented in a direction perpendicular to a direction of movement of the camming mechanisms. In the '045 patent, a receiver frame has fixture alignment pins on one or both sides of the receiving for aligning a fixture for engagement with the receiver assembly. One or more mounting members extend across a face of the receiver, adjacent the sides of the receiver frame, displaced from the sides of the receiver frame, or both. Each mounting member has one or more module mounting holes therein. One or more modules of similar or varying types and sizes are mounted on the receiver frame by connecting the modules to one or more mounting members. In this arrangement, the modules are mounted perpendicular to the direction of movement of the linearly moving engagement slides, or perpendicular to the plane of rotation or movement in a rotating latch or other cam embodiment. By arranging the modules in this manner, a lower profile interface device may be achieved. The modules may accommodate any type of contact, including, but not limited to, signal, power, coaxial, high frequency, pneumatic and fiber optic. Each module is mounted to the receiver frame by connecting the module to two mounting members in the receiver frame. The modules may be connected to the module mounting members via any of a variety of known methods such as with screws or spring means. At each side of the receiver assembly, there is an engagement slide and a receiver outside wall. Each engagement slide has a cam slot and an elongated guide slot therein. Each sidewall has a pair of pins, each having a bearing thereon for guiding the engagement slide in a linear motion. Each receiver outer sidewall further may have slots or recesses therein. Such recesses may accommodate pins extending from the sides of test adapters and may or may not be designed to guide the test adapters into the receiver. The cam slots in the engagement slides are use to exert force on pins, or pins having bearing thereon, on the sides of test adapters to draw the test adapters into the receiver. The camming action likewise could be performed by a plate that rotates around a single pin rather than moving linearly.

Although these devices generally functioned well and provided advantages over prior devices, the devices did not provide users with convenient access to the connectors and wires of a test adapter after the test adapter had been assembled. Such access may be desirable to perform troubling shooting tasks and repairs on the test adapters. Further, the devices included many components, including some machined parts, which contributed to expense and increased time for manufacturing and assembling the products.

SUMMARY OF THE INVENTION

In a preferred embodiment, the present invention is a receiver having multiple tiers such that a first tier in the receiver houses a module having its longest dimension in first direction and a second tier houses a module having its longest dimension in second direction perpendicular to the first direction. Each tier of the receiver may have a single opening formed therein for receiving modules or a plurality of openings therein. The receiver has three or more cams on each of two parallel sides. The cams on a single side may be separate mechanisms or may be combined in a single mechanism such as a slide plate having a plurality of camming slots (one slot corresponding to each cam).

The receiver is capable of being mated with various types of test adapters, some of which may be referred to as "legacy" test adapters because they have a conventional structure having two pairs of parallel sides (one pair of which may be referred to as the top and bottom) with each side in one of the pairs having two or more locator elements therein for engaging with the cams of the receiver. When such a conventional test adapter is mated with a receiver of the present invention, the two or more locator elements on one side of the test adapter mate with an equal number of cams on the corresponding side of the receiver. The receiver further is capable of mating with a test adapter of the present invention in which the test adapter has three or more locator elements on each side. For example, if the receiver had three cams per side, the corresponding test adapter would have three locator elements on each corresponding side.

In a preferred embodiment, the present invention is an interface or mass interconnect device. The device comprises a receiver. The receiver comprises a frame and a plurality of module mounting members. The frame has first, second, third and fourth sides, the first and second sides opposing one another and the third and fourth sides opposing one another, the first and second sides each being connected between the third and fourth sides and being substantially perpendicular to the third and fourth sides. The frame is comprised of multiple parts or one homogenous body. A first module mounting member is connected or mounted to and between the first side and the second side, the first module mounting member being substantially parallel to the third side. The second module mounting member is connected or mounted to and between the first module mounting member and the fourth side, the second module member being substantially parallel to the first side. The first module mounting member and the third side each have module mounting means for mounting a plurality of modules to and between the first module mounting member and the third side. The second module mounting member and the first side each have module mounting means for mounting a plurality of modules to and between the second module mounting member and the first side.

In another preferred embodiment, the mass interconnect device may comprise a third module mounting member mounted to and between the first module mounting member and the fourth side, wherein the second and third module mounting members each have module mounting means for mounting a plurality of modules to and between the second and third module mounting members, and wherein the third module mounting member and the second side have mounting means for mounting a plurality of modules to and between the third module mounting member and the second side.

In further embodiments, the fourth side of the frame may comprise guide or support means such as a rigid member having an indentation therein and a guide or support plate fixed to the rigid member in the indentation. The third side likewise may comprise a rigid member having an indentation therein and a guide plate fixed to the rigid member in the indentation.

A plurality of first modules may be mounted to and between the first module mounting means and the third side, the first modules having a length and width wherein the length is greater than the width. A plurality of second modules mounted to and between the second module mounting means and the first side.

The receiver frame may further comprise a plurality of engagement cams positioned adjacent to the first side of the receiver frame, the engagement cams being moveable relative to the first side; and a plurality of engagement cams positioned adjacent to the second side of the receiver frame, the engagement cams being moveable relative to the second side. The plurality of engagement cams positioned adjacent to the first side may comprise three or more engagement cams and the plurality of engagement cams positioned adjacent to the second side may comprise three or more engagement cams.

The mass interconnect device of a preferred embodiment may further comprise a test adapter. The test adapter comprises a frame. The frame comprises first and second pairs of opposing sides, the first pair of opposing sides each comprising a rigid member and a plurality of pins protruding from the rigid member, each of the plurality of pins being positioned on the first pair of opposing sides to align with one of the engagement cams on the receiver when the test adapter is mated with the receiver. The plurality of pins may comprise, for example, two, three or four pins on each the first pair of opposing sides.

In another embodiment, the plurality of engagement cams positioned adjacent to the first side comprise a plate having a plurality of cam slots therein. Similarly, the plurality of engagement cams positioned adjacent to the second side comprise a plate having a plurality of cam slots therein.

In another embodiment, the receiver frame further comprises a first plate positioned adjacent to the first side of the receiver frame and being moveable in a direction parallel to the first side, wherein the first plate has a plurality of cam slots therein and a second plate positioned adjacent to the second side of the receiver frame and being moveable in a direction parallel to the second side, wherein the second plate has a plurality of cam slots therein. Still further, the mass interconnect device may comprise a test adapter. The test adapter may comprise a frame comprising first and second pairs of opposing sides, the first pair of opposing sides each comprising a rigid member and a plurality of pins protruding from the rigid member, each of the plurality of pins being positioned on the first pair of opposing sides to align with one of the cam slots on the receiver when the test adapter is mated with the receiver.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

The invention of the present application will now be described in more detail with reference to preferred embodiments of the architecture and method, given only by way of example, and with reference to the accompanying drawings, in which.

DESCRIPTION OF THE PREFERRED EMBODIMENTS

Figure 1:
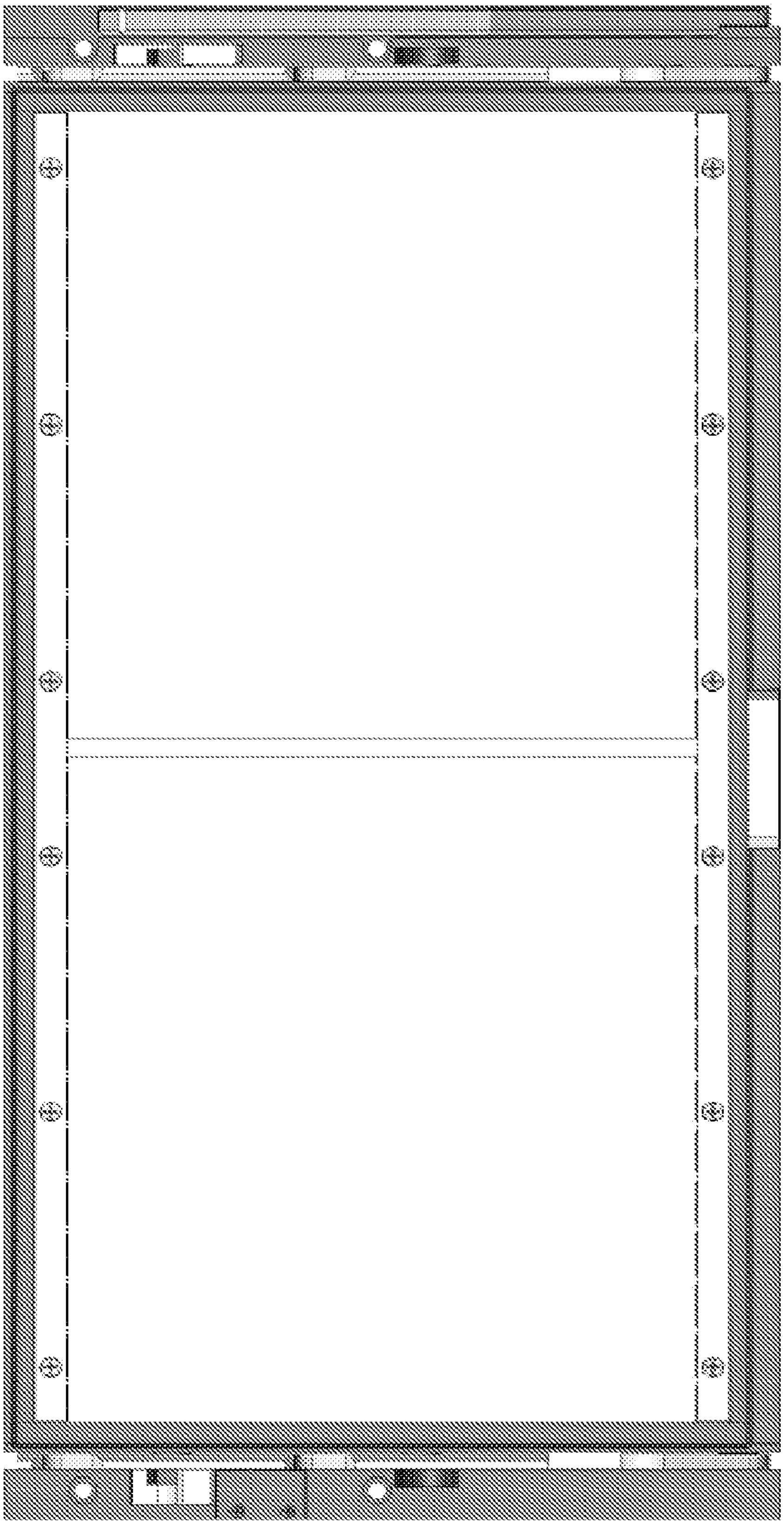
FIG. 1 PRIOR ART
FIG. 1 is a front view of a receiver of a prior art mass interconnect device.
Figure 2:
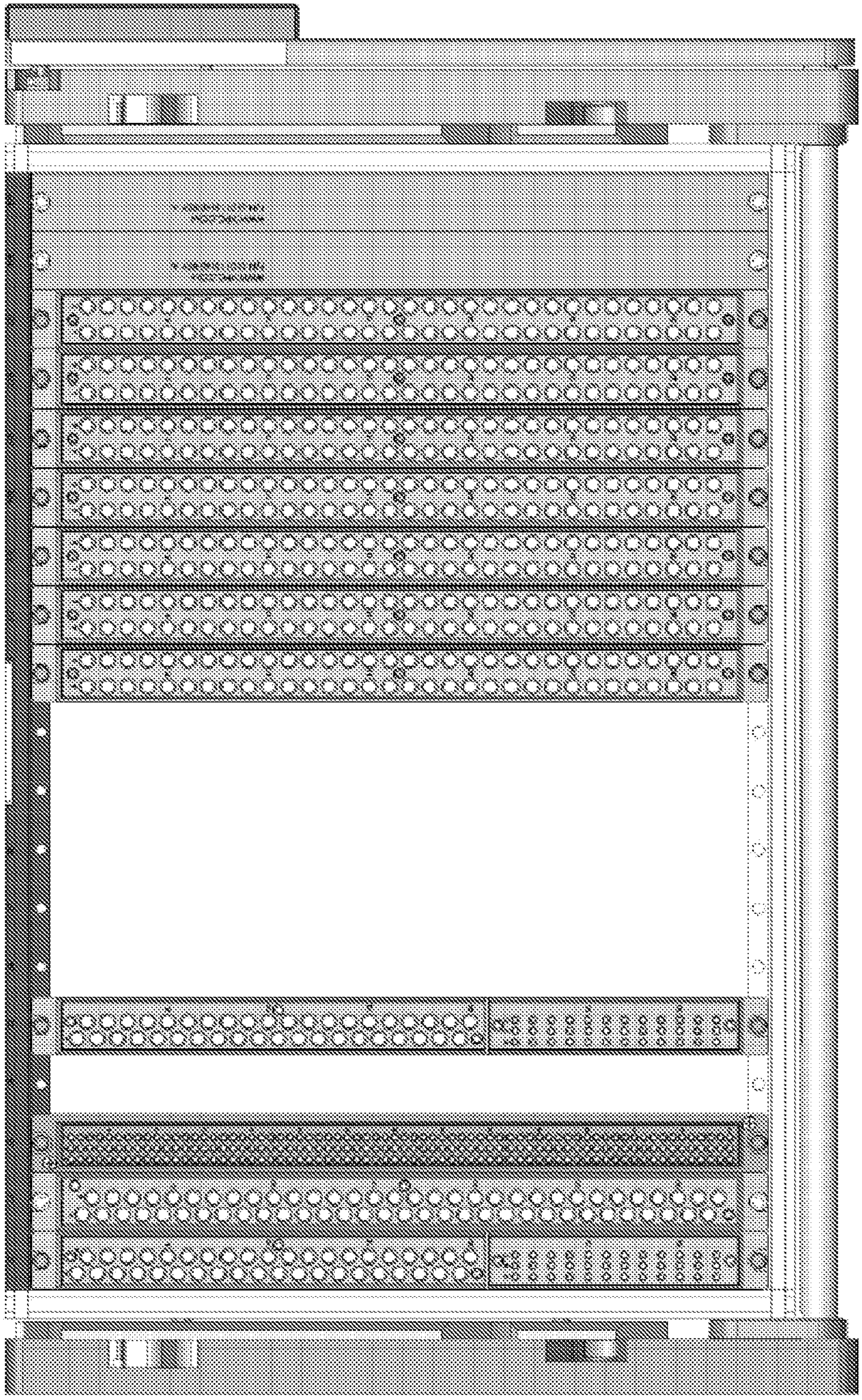
FIG. 2 PRIOR ART
FIG. 2 is a front view of a receiver of a second prior art mass interconnect device having a plurality of modules mounted therein.

Typical mass interconnect devices have a receiver and a test adapter that mate to form a large number of electrical connections nearly simultaneously. Over the past twenty years, technology relating to such interface devices has evolved, thereby enabling wider varieties of contacts to be included in such mass interconnect devices and larger numbers of connections to be made using smaller areas, i.e., having higher density of contacts. Due to the wide proliferation of the older interface devices, there is a need for a new interface device, and in particular a new receiver, that is capable of mating with an old, or legacy, test adapter, but also is capable of mating with a new test adapter having the ability to incorporate or support both newer, denser arrangements of contacts and older arrangements of contacts.

A preferred embodiment of a receiver of the present invention is described with reference to FIG. 3. The receiver shown in FIG. 3 has two pairs of opposing outer sides, 310, 312 and 320, 330 that form a rectangular or square frame. Opposing sides 320, 330 also may be referred to as a bottom 330 and a top 320, depending on how the receiver is arranged when in use. For example, if the receiver is mounted on a rack in a vertical manner, side 320 may be considered the "top" and side 330 may be considered the "bottom."

Figure 3:
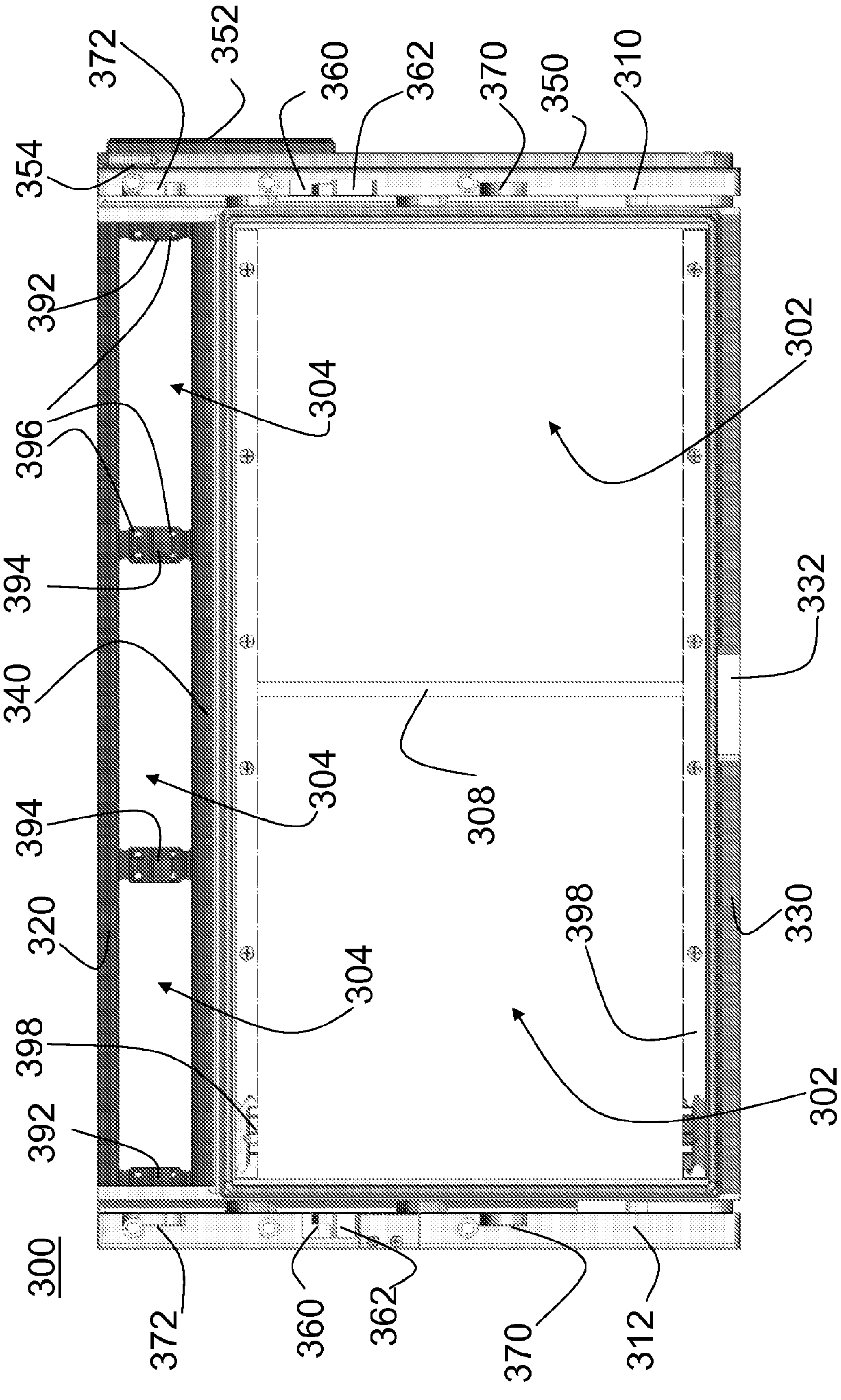
FIG. 3 is a front view of a receiver of a preferred embodiment of the present invention.

As shown in FIG. 3, the face of the receiver 300 has a plurality of openings 302, 304 therein. The openings 304 are framed by the top side 320, support member 340 and module mounting members 392, 394. The module support members 392, 394 have means such as threaded screw holes 396 therein for mounting modules across the openings 304. While three openings 304 are shown in the embodiment of FIG. 3, one of skill in the art will understand that arrangements have other numbers of openings 304, such as 2, 3, 4 or more are possible. The openings 302 are framed by sides 310, 320, module mounting members 398 and support member 308. While two openings 302 are shown in FIG. 3, one of skill in the art will recognize that if support member 308 were excluded, a single opening arrangement is possible as are arrangements with more than two openings by having additional support members. One of the module mounting members 398 is adjacent to the bottom side 330 in this embodiment while the other module mounting member is adjacent to the support member 340. The module mounting members 398 may be attached to bottom side 330 and support member 340, respectively may be formed integral with the bottom side 330 and the support member 340, and/or may be attached to sides 310, 320. The bottom 330 additionally has an alignment plate 332 for aligning with a recess, slot or other opening in a test adapter to assist in properly aligning the test adapter with the receiver. An opposite arrangement in which the alignment plate is attached to the test adapter and the receiver has a recess, slot or other opening to accommodate that alignment plate also is possible. In other embodiments and alignment pin and opening arrangement could be used in place or in addition to the alignment plate/recess arrangement.

Figure 4:
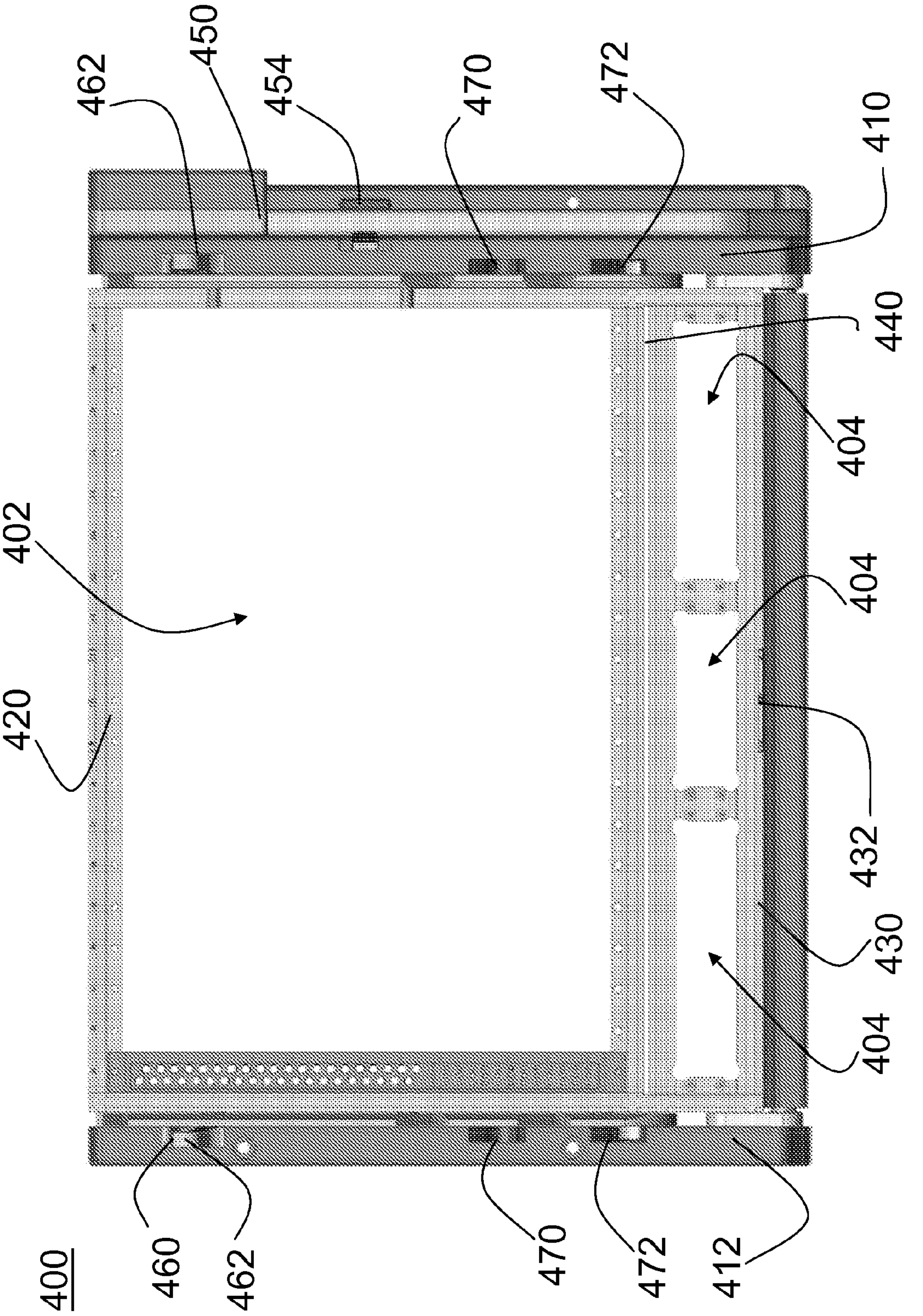
FIG. 4 is a front view of a receiver of a second preferred embodiment of the present invention.

Each side 310, 312 has at least one guide plate 360 having a straight slot therein (shown in FIG. 5) and a hanger element 362 extending there from. While the guide plate 360 and hanger element 362 is shown in FIG. 3 as being located between the openings 370, 372, the guide plate could be located in a different position such as is shown in FIG. 4 with the guide plate 460 "above" the openings 470. Similarly, the hanger element 362 need not be part or connected to the guide plate at all, but rather could be connected to or a portion of a side adjacent openings 370 or 372. The guide plates 360 may be attached to the respective sides 310, 320 or formed integral therewith. Each side additionally has an opening 370 therein. In a preferred embodiment, each side has two openings 370, 372 therein in addition to the opening in the guide plate 360. The openings 370, 372 extend partially into the side to receive a pin extending from a side of a test adapter. The slot in each guide plate 360 is of a size suitable for receiving a guide pin extending from a side of a test adapter and guiding the test adapter, via the guide pin, straight into the receiver during engagement of a test adapter with the receiver. Each side further has a slide plate 480 (shown in FIG. 5) having camming slots 482, 484 and 486 (also shown in FIG. 5) therein. The slide plates and camming slots will be described in detail below in connection with FIG. 5. Further, the hanger elements 362 could be connected to the slide plates adjacent the camming slots in the slide plates rather than to the guide plates. While slide plates are shown in described in connection with the preferred embodiments, other camming mechanisms such as a rotating latch similarly could be used. One side 310 further has a handle 350 used together with linkage (not shown) and a torsion shaft (not shown) to move the slide plates to draw a test adapter into the receiver. The handle 350 in the embodiment shown in FIG. 3 has a flange 352 and a latch 354. While linkage is used in a preferred embodiment, other means such as gears may be used.

When modules are installed in the receiver of the embodiment shown in FIG. 3, the modules extending across the openings 302 will be in a direction parallel to the sides 310, 312, which one might refer to as a vertical direction if the receiver is mounted in a vertical manner. The modules extending across the openings 304 are mounted in a direction parallel to the sides 320, 340, which one might refer to as a horizontal direction if the receiver is mounted in a vertical manner. Thus, the modules across the openings 304 will be perpendicular to the modules across the openings 302.

In the embodiment shown in FIG. 3, the two pins extending from each sides of a conventional or legacy test adapter respectively will align with the opening 370 and the slot in the guide plate 360. Rather than having just two pins extending from each side, a test adapter in accordance with a preferred embodiment of the present invention has three pins extending from each side. The three pins respectively will align with slot 370, the slot in guide plate 360, and slot 372.

A second embodiment with a single opening 402 adjacent the top side 420 of a receiver 400 and a plurality of smaller openings 404 adjacent the bottom side 430 of receiver 400 is shown in FIG. 4. The latter opening 402 is framed by top side 420, sides 410, 412, and member 440. In this embodiment, a guide plate 460 with a hanger element 462 is secured to or formed integral with each side 410, 412 nearer to the top side 420 than openings 470, 472. In the embodiment shown in FIG. 4, the two pins extending from the side of each conventional or legacy test adapter will align with the slot in guide plate 460 and the slot 470. the receiver further has a handle 450 with a latch 454.

An alignment plate 432 for aligning with a recess (not shown) in a test adapter in accordance with a preferred embodiment of the invention is shown adjacent the bottom side 430. Another alignment plate or a recess may be connected to or formed integral with the top side 420 for aligning with a recess in a conventional or legacy test adapter. Thus, the received may have an alignment plate at its top, at its bottom, or at both its top and bottom.

Figure 5:
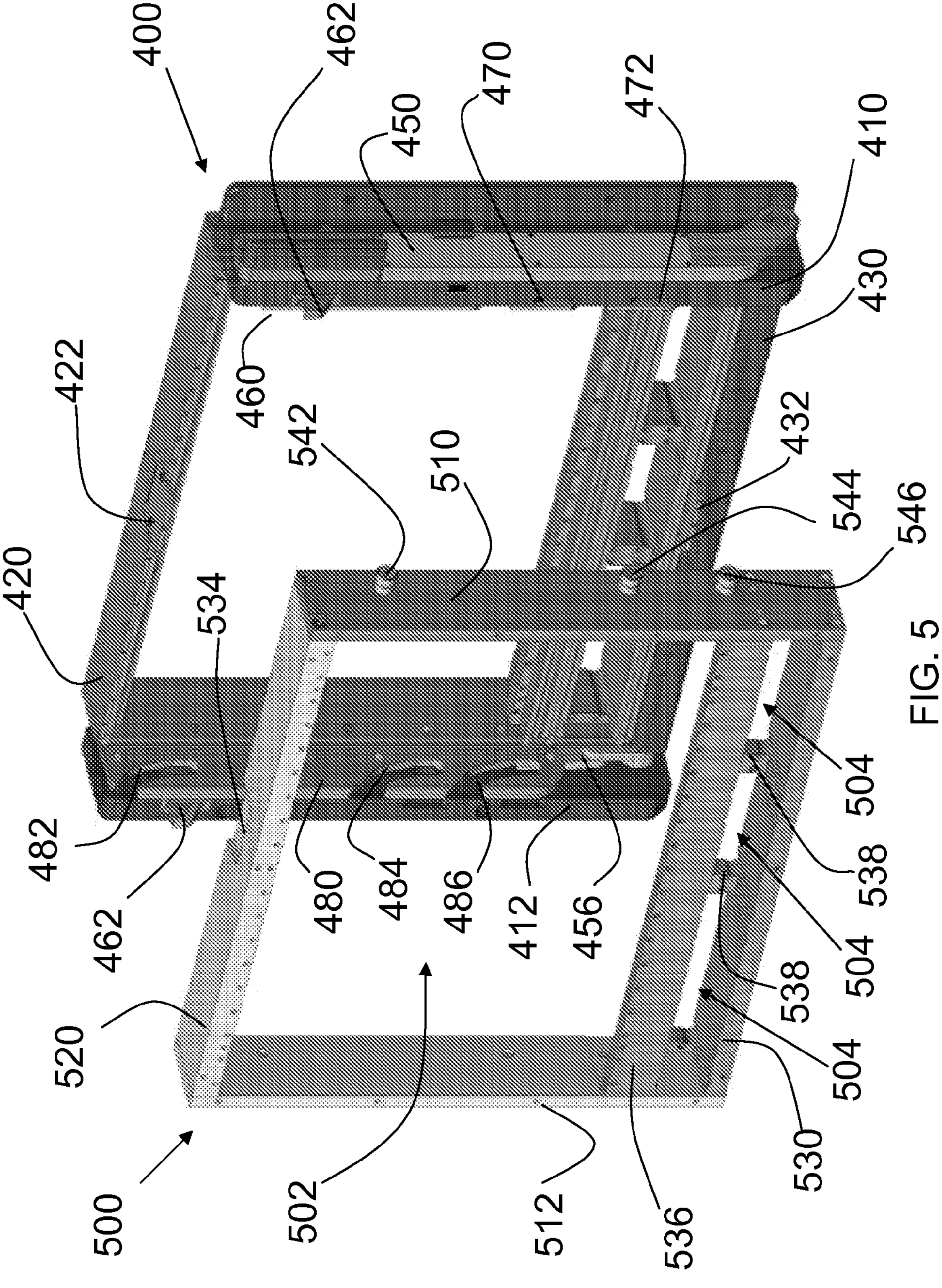
FIG. 5 is a perspective view of a receiver shown in FIG. 4 together with a test adapter in accordance with a preferred embodiment of the present invention.

A perspective view of a receiver and test adapter in accordance with a preferred embodiment of the present invention is shown in FIG. 5. As shown in FIG. 5, on each side 410, 412 there is a slide plate 480 having three camming slots 482, 484, 486 therein. In FIG. 5, an alignment plate 422 is shown at the top side of the receiver in addition to the alignment plate 432 at the bottom of the receiver. The alignment plates align with a groove, indentation or slot in a test adapter, such as the indentation 534 shown in FIG. 5 or 634 shown in FIG. 6. The receiver 400 in FIG. 5 is shown adjacent to a test adapter 500 in accordance with a preferred embodiment of the present invention. The test adapter has four sides 510, 512, 520 and 530. Side 520 may be referred to as a top side while side 530 may be referred to as a bottom side if the receiver 400 is mounted in a vertical position. Each side 510, 512 has three pins 542, 544, 546 extending there from to assist in guiding and camming the test adapter 500 into the receiver 400. In FIG. 5, all three pins on each side are shown as having split roller bearing thereon. Other embodiments in which only one or two of the pins have split roller bearings thereon are possible, although it is preferable that the pins that align with the slots in guide plates 460 have split roller bearings. The test adapter 500 further has a mounting member 536, which together with sides 510, 512 and 530 form a rectangular or square opening 502. The test adapter 500 further has mounting members 538 that together with mounting member 536 and sides 510 and 512 form a plurality of openings 504.

To engage the test adapter 500 in the receiver 400, the handle 450 is opened by releasing the latch 454 and pulling the handle down (or away from the side 410). When the handle is opened, the slide plates 480 are caused to move down by linkage 456 and a torsion shaft (not shown) such that the openings in the camming slots 482, 484, and 486 respectively align with the openings of the guide slots in the guide plates 460 and the openings 470 and 472 in the sides 310, 312. The test adapter pins 542 (on each side) are then placed or hung on hanger elements 462. The test adapter is then pushed into (or toward the face of the receiver) such that the three pins on each side of the test adapter enter the camming slots 482, 484 and 486, respectively. When the handle is close, the linkage 454 provides mechanical advantage to move the slide plates up thereby causing the camming slots 482, 484 and 486 to apply forces to the test adapter pins 542, 544, 546 to draw the test adapter into the receiver. In this manner, large numbers of contact pins held in modules in the receiver and test adapter can be mated safely through the single action of closing the handle.

Figure 6:
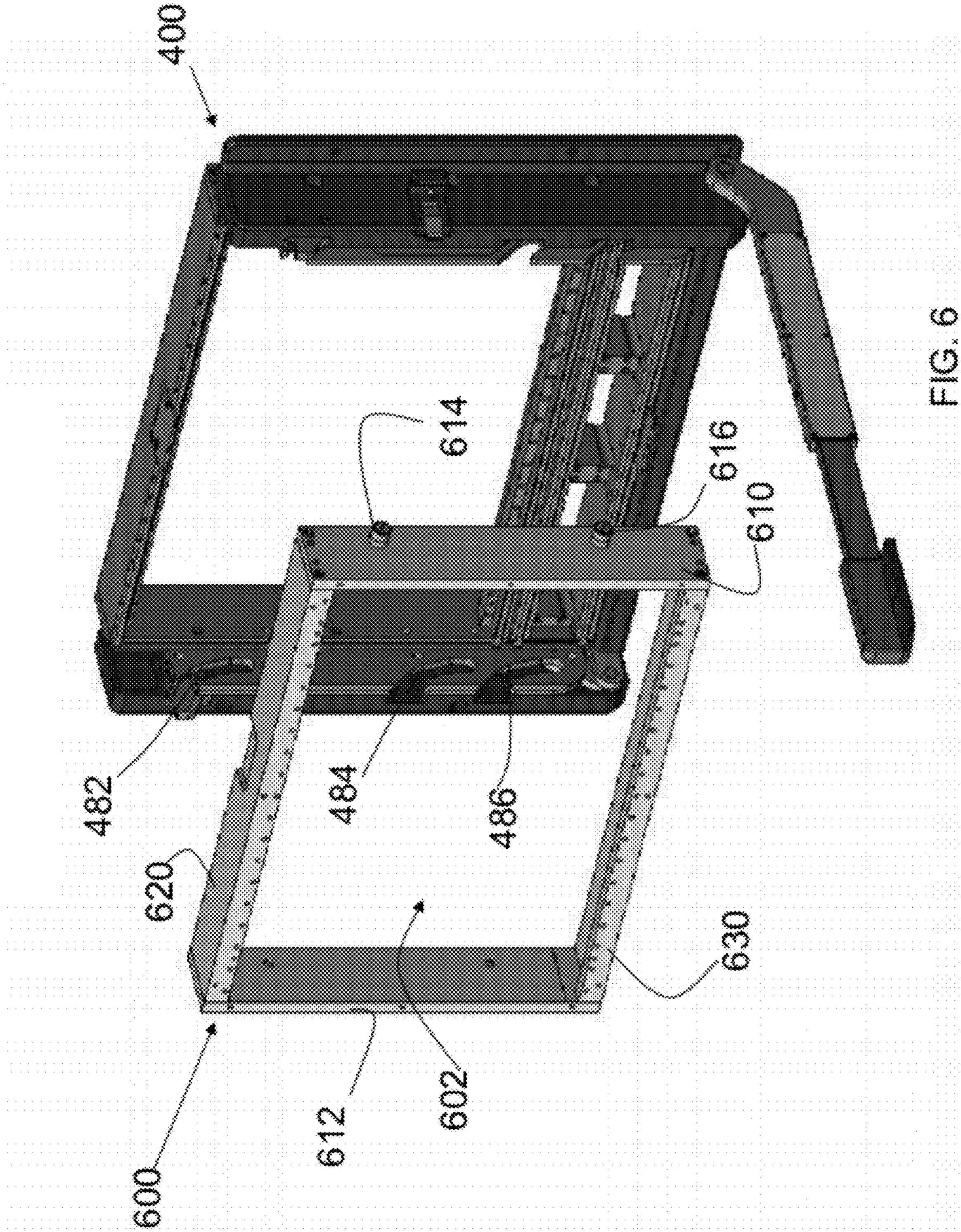
FIG. 6 is a perspective view of a receiver shown in FIG. 4 together with a legacy test adapter.

In FIG. 6, a receiver 400 in accordance with a preferred embodiment of the present invention is shown in a position ready to be engaged with a conventional or legacy test adapter 600. The conventional test adapter has four sides 610, 612, 620, 630 that form an opening 602. The conventional test adapter has only two pins 614, 616 on each side 610, 612. When engaged in a receiver in accordance with the present invention, the pins 614 engage with camming slots 482 while the pins 616 engage with camming slots 484.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A mass interconnect device comprising:

a receiver comprising:

a frame having first, second, third and fourth sides, said first and second sides opposing one another and said third and fourth sides opposing one another, said first and second sides each being connected between said third and fourth sides and being substantially perpendicular to said third and fourth sides;

a first module mounting member connected to and between said first side and said second side, said first module mounting member being substantially parallel to said third side;

a second module mounting member mounted to and between said first module mounting member and said fourth side, said second module member being substantially parallel to said first side;

wherein said first module mounting member and said third side each have module mounting means for mounting a plurality of modules of a first size to and between said first module mounting member and said third side; and wherein said second module mounting member and said first side each have module mounting means for mounting a plurality of modules of a second size to and between said second module mounting member and said first side wherein said second size is different than said first size.

2. A mass interconnect device according to claim 1, further comprising:

a third module mounting member mounted to and between said first module mounting member and said fourth side, wherein said second and third module mounting members each have module mounting means for mounting a plurality of modules to and between said second and third module mounting members, and wherein said third module mounting member and said second side have mounting means for mounting a plurality of modules to and between said third module mounting member and said second side.

3. A mass interconnect device according to claim 1, wherein said fourth side comprises:

a rigid member having an indentation therein; and a guide plate fixed to said rigid member in said indentation.

4. A mass interconnect device according to claim 3, wherein said third side comprises:

a rigid member having an indentation therein; and a guide plate fixed to said rigid member in said indentation.

5. A mass interconnect device according to claim 1, further comprising:

a plurality of first modules mounted to and between said first module mounting means and said third side, said first modules having a length and width wherein said length is greater than said width.

6. A mass interconnect device according to claim 5, further comprising:

a plurality of second modules mounted to and between said second module mounting means and said first side.

7. A mass interconnect device according to claim 1, wherein said receiver frame further comprises:

a plurality of engagement cams positioned adjacent to said first side of said receiver frame, said engagement cams being moveable relative to said first side; and a plurality of engagement cams positioned adjacent to said second side of said receiver frame, said engagement cams being moveable relative to said second side.

8. A mass interconnect device according to claim 7, wherein said plurality of engagement cams positioned adjacent to said first side comprises three or more engagement cams and said plurality of engagement cams positioned adjacent to said second side comprises three or more engagement cams.

9. A mass interconnect device according to claim 8, further comprising:

a test adapter comprising:

a frame comprising first and second pairs of opposing sides, said first pair of opposing sides each comprising a rigid member and a plurality of pins protruding from said rigid member, each of said plurality of pins being positioned on said first pair of opposing sides to align with one of said engagement cams on said receiver when said test adapter is mated with said receiver.

10. A mass interconnect device according to claim 9, wherein said plurality of pins comprises three or more pins on each said first pair of opposing sides.

11. A mass interconnect device according to claim 7, wherein said plurality of engagement cams positioned adjacent to said first side comprises a plate having a plurality of cam slots therein.

12. A mass interconnect device according to claim 1, wherein said receiver frame further comprises:

a first plate positioned adjacent to said first side of said receiver frame and being moveable in a direction parallel to said first side, wherein said first plate has a plurality of cam slots therein; and a second plate positioned adjacent to said second side of said receiver frame and being moveable in a direction parallel to said second side, wherein said second plate has a plurality of cam slots therein.

13. A mass interconnect device according to claim 12, further comprising:

a test adapter comprising:

a frame comprising first and second pairs of opposing sides, said first pair of opposing sides each comprising a rigid member and a plurality of pins protruding from said rigid member, each of said plurality of pins being positioned on said first pair of opposing sides to align with one of said cam slots on said receiver when said test adapter is mated with said receiver.

14. A mass interconnect device comprising:

a receiver comprising:

first and second tiers, wherein said first tier in said receiver houses a module having its longest dimension in a first direction and said second tier houses a module having its longest dimension in a second direction perpendicular to said first direction; and two parallel sides, wherein each of said two parallel sides has an odd number of cams for pulling a test adapter into engagement with said receiver.

* * * * *